United States Patent [19]

Kee

[11] Patent Number: 5,715,989
[45] Date of Patent: Feb. 10, 1998

[54] MICROELECTRONIC WIRE BONDING USING FRICTION WELDING PROCESS

[75] Inventor: David R. Kee, Richardson, Tex.

[73] Assignee: Texas Instruments Incorporated, Dallas, Tex.

[21] Appl. No.: 657,492

[22] Filed: Jun. 4, 1996

[51] Int. Cl.⁶ .............................................. H01L 21/603
[52] U.S. Cl. ............................ 228/114.5; 228/180.5
[58] Field of Search .......................... 228/112.1, 114.5, 228/180.5, 2.3; 219/56.21; 156/73.5

[56] References Cited

U.S. PATENT DOCUMENTS

| | | | |
|---|---|---|---|
| 3,296,692 | 1/1967 | Griffin | 228/180.5 |
| 4,542,843 | 9/1985 | Middleton | 228/114.5 |
| 4,628,150 | 12/1986 | Luc | 228/112.1 |
| 5,277,356 | 1/1994 | Kawauchi | 228/180.5 |

FOREIGN PATENT DOCUMENTS 1 230 916  12/1966  Germany .............................. 228/114.5

*Primary Examiner*—Samuel M. Heinrich
*Attorney, Agent, or Firm*—W. James Brady, III; Richard L. Donaldson

[57] ABSTRACT

A method of low temperature securing a wire to a bond pad in a microelectronic semiconductor device which includes providing a semiconductor die having a bond pad thereon and providing a wire to be secured to the bond pad. One of the bond pad and wire is rotated relative to the other and the pad is contacted with the wire while the bond pad and the wire are rotating relative to each other until the interface of the wire and the bond pad diffuse into each other sufficiently to provide a bond therebetween upon cooling to secure the wire to the bond pad. Preferably the die is stationary and the wire is rotated. The wire is then cut to a predetermined length. By this method, it is possible to weld together dissimilar metals as well as metals which were previously no available in the fabrication procedures being utilized such as, for example, wherein the wire and the bond pad are both copper, wherein the wire is copper and the bond pad is aluminum, or wherein the wire is copper and the bond pad is titanium tungsten.

18 Claims, 1 Drawing Sheet

MICROELECTRONIC WIRE BONDING USING FRICTION WELDING PROCESS

BACKGROUND OF THE INVENTION

1. Field of the Invention

This invention relates to a method of bonding wire to a semiconductor substrate by friction welding in general and, more specifically, to friction welding of wire to weld regions, such as bond pads, on a semiconductor device.

2. Brief Description of the Prior Art

Low temperature wire bonding in semiconductor devices is generally accomplished by using thermocompression welding or ultrasonic welding wherein acoustic energy is coupled through a bond tool to the bond pad on the substrate to which the wire is to be bonded. Such bonding techniques generally take place at elevated temperatures in the vicinity of 200° C. In addition, in ultrasonic bonding, the shape of the tool required to insure reasonable bonding results in large area bond pad requirements. This large real estate requirement is an impediment to the continual effort to provide an increased number of components on a semiconductor chip of given dimensions. In addition, the materials which can be bonded ultrasonically are limited on the basis of present technology to similar metals and metals which are compatible with process flows involving the elevated temperatures required in the above described bonding techniques. This often eliminates materials of choice, particularly copper, but for the bonding technique to be used. It is therefore apparent that a bonding procedure which utilizes less real estate than in the prior art and/or that can utilize materials not available in thermocompression or ultrasonic bonding techniques is highly desirable.

Friction welding per se is well known and is described, for example, in *Friction Welding of Metal*, by V. I. Vill which is incorporated herein by reference in its entirety. When making the bonds using friction welding, various foreign inclusions, surface oxides and absorbed films that are always present and oppose the formation of such bonds are destroyed and removed from the point by the abrasion of the surfaces produced by friction. The destruction and removal of foreign inclusions is greatly favored by the plastic deformation of the heated ends of the pieces to be welded. The metal in the joint zone is squeezed out radially by the axial pressure. The quality of the welded junction and, particularly the efficiency of the friction welding process depends to a large degree on the relative velocity of the friction surfaces and on the axial force applied during the heating period. However, there is no known prior art application of friction welding in the fabrication of microelectronic devices.

SUMMARY OF THE INVENTION

The above noted desired advantages are obtained in accordance with the present invention by utilizing a friction welding procedure to make low temperature welds to a wide variety of microelectronic substrate materials.

Low temperature friction welding can be used to join dissimilar metals with the resulting weld saving about 65% of the area required for bond pads. Low temperature friction welding can also be used in conjunction with metals that are not generally available in conjunction with thermocompression or ultrasonic welding techniques, copper being a particular example of such a metal. Friction welding also confines the heat produced to the immediate region of the weld, thereby minimizing the possibility of heat damage at other regions of the semiconductor device being fabricated. It follows that friction welding provides a low cost process having the capability of joining dissimilar metals in semiconductor fabrication, the ability to utilize metals not previously available on an economic scale, an ability to control the length of the wire, thereby permitting the design to compensate for stresses between the die and the substrate and a reduction of stress in the die.

Briefly, the above is accomplished by holding one of the parts to be welded (i.e., either the wire or the die) in a stationary jaw of some type with the other part to be welded being held in a lathe-type mechanism and rotated while forcing the rotating part into contact with the stationary part. The force required and rotational speed required will depend upon the materials involved and the volume and mating area at the interface of the materials involved. The rotary action of the rotating part to be welded initially essentially cleans the surface of the other part which will form the weld at the interface of oxidation and any other surface contaminants. With further rotation of the rotating part, the parts to be welded are heated up by the friction involved at the interface thereof and weld together in standard manner. The procedure is a low temperature procedure which can be effected at room temperature, though the temperature can be further elevated externally if desired or necessary. The heated zone is confined almost entirely to the region at the interface and immediately adjacent to the weld.

In accordance with the above described procedure, it is also possible to form posts (as an alternative to bumps) that offer a low cost process and selective wire lengths for making the interconnect to a substrate. Most prior art bump solutions use a plating process that is limited in composition and bump height. Other conventional wire bond solutions use gold wire which becomes very costly and is uneconomical in many applications.

The above described procedure is particularly effective when used in conjunction with large diameter wire on the order of about 10 to about 15 mils.

The procedure involves securing one of a semiconductor die or the wire to be bonded thereto, preferably the semiconductor die, in a stationary jaw and securing the other of the semiconductor die or the wire, preferably the wire, in a rotating mandrel or lathe-type device. The rotating mandrel with wire rotating therewith is then moved toward the semiconductor die so that the end of the wire comes in contact with that portion of the die to which the bond is to be made. The mandrel is rotated to remove surface oxides and other contaminants by the frictional action of the wire against the die. Upon further rotation of the wire, heat is generated at the interface of the wire and the die, causing the wire to weld to the die at the interface. The frictional rotation combined with axial pressure is continued until an appropriate weld is provided, based upon maintaining the maximum strength in the heat affected zone, and the wire is then cut to the desired length to complete the procedure. In establishing welding procedures for friction welding of any die (the determination of the rotational speed, unit pressure, duration of the process and the upset), one must proceed experimentally under guidance of available procedures.

DESCRIPTION OF THE PREFERRED EMBODIMENT

Figure 1:
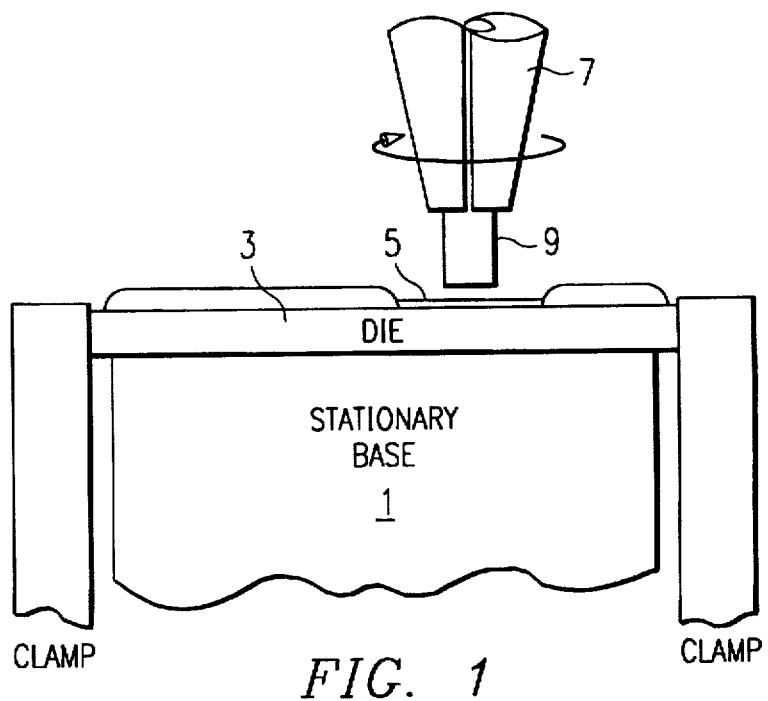
FIG. 1 shows a typical arrangement for friction welding a wire to a semiconductor die in accordance with the present invention.

Referring to FIG. 1, there is shown an arrangement for providing a friction weld in accordance with the present invention. The arrangement includes a stationary base 1 to which is secured a semiconductor die 3 having a bond pad 5 thereon. A rotating mandrel 7 which rotates in the direction shown by the arrow has a wire 9 secured therein and extending outwardly therefrom which rotates the wire. The mandrel 7 can be controlled to rotate at a predetermined rotary speed or in accordance with a program whereby the rotary speed can vary with time.

Figure 2:
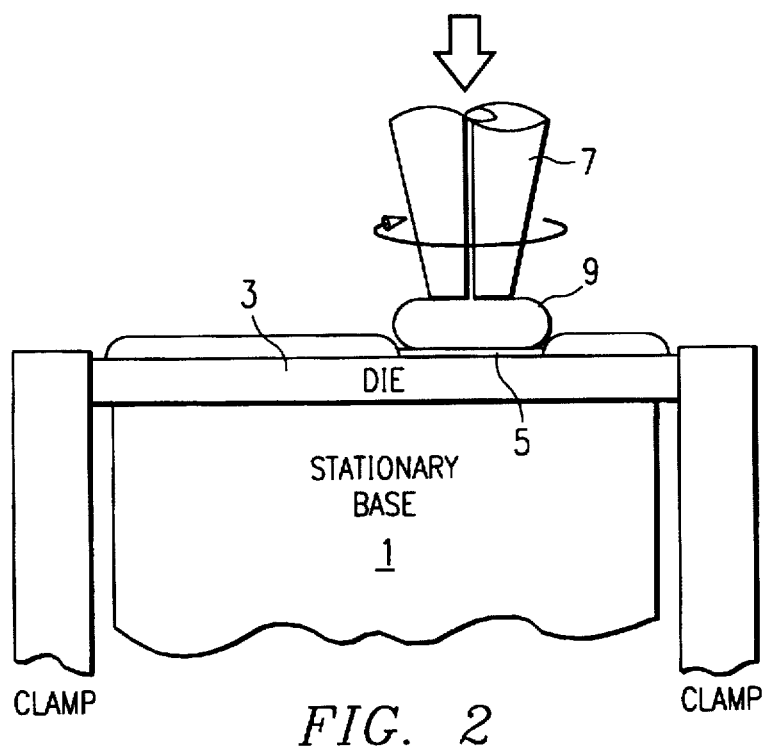
FIG. 2 shows the arrangement of FIG. 1 after the mandrel has moved toward the bond pad and the wire is in contact with the bond pad.

In operation, the die 3 is secured in the stationary base and the wire 9 is rotated with the mandrel 7 with the wire and mandrel then being moved toward the bond pad 5 as shown by the arrow in FIG. 2 until the wire contacts the bond pad. The movement of the wire 9 toward the bond pad 5 then ceases and the wire 9 continues to rotate while in contact with the bond pad until a welding action takes place due to the heat generated. If necessary, a heating unit (not shown) can be placed in, on or adjacent the base 1 to provide additional heat to the interface of the wire 9 and the pad 5. After the weld is completed, the mandrel 7 is withdrawn with the wire 9 being let out and then cut at a desired distance from the weld to complete the welding operation.

In accordance with the above described procedure, the wire 9 and the bond pad 5 can be the same metal or dissimilar metals. Preferred combinations are copper as each metal, a copper wire to an aluminum bond pad and copper to a titanium tungsten bond pad. However, any metals compatible with friction welding can be used.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of securing a wire to a bond pad in a microelectronic semiconductor device comprising the steps of:
   (a) providing a semiconductor die having a bond pad thereon;
   (b) providing a wire to be secured to said bond pad;
   (c) rotating one of said bond pad and said wire relative to the other; and
   (d) contacting said pad with said wire while said bond pad and said wire are rotating relative to each other to secure said wire to said bond pad.

2. The method of claim 1 wherein step (d) includes the step of rotating wire relative to said bond pad until the interface of said wire and said bond pad diffuse into each other sufficiently to provide a bond therebetween upon cooling.

3. The method of claim 1 wherein said die is stationary and said wire is rotated.

4. The method of claim 2 wherein said die is stationary and said wire is rotated.

5. The method of claim 1 further including the step of cutting said wire to a predetermined length after step (d).

6. The method of claim 2 further including the step of cutting said wire to a predetermined length after step (d).

7. The method of claim 4 further including the step of cutting said wire to a predetermined length after step (d).

8. The method of claim 1 wherein said wire and said bond pad are both copper.

9. The method of claim 2 wherein said wire and said bond pad are both copper.

10. The method of claim 4 wherein said wire and said bond pad are both copper.

11. The method of claim 1 wherein said wire is copper and said bond pad is aluminum.

12. The method of claim 2 wherein said wire is copper and said bond pad is aluminum.

13. The method of claim 4 wherein said wire is copper and said bond pad is aluminum.

14. The method of claim 1 wherein said wire is copper and said bond pad is titanium tungsten.

15. The method of claim 2 wherein said wire is copper and said bond pad is titanium tungsten.

16. The method of claim 4 wherein said wire is copper and said bond pad is titanium tungsten.

17. A method of securing a wire to a bond pad in a microelectronic semiconductor device comprising the steps of:
   (a) providing a semiconductor die having a bond pad thereon;
   (b) providing a wire to be secured to said bond pad;
   (c) rotating one of said bond pad and said wire relative to the other; and
   (d) contacting said pad with said wire while said bond pad and said wire are rotating relative to each other to heat only the interface region of said bond pad and said wire to a temperature sufficiently high to cause interdiffusion of said wire and said bond pad at said interface sufficient to secure said wire to said bond pad.

18. The method of claim 17 further including the step of cutting said wire after step (d) to a predetermined length.

* * * * *